United States Patent [19]

Eichen et al.

[11] Patent Number: 5,103,455

[45] Date of Patent: Apr. 7, 1992

[54] MONOLITHICALLY INTEGRATED SEMICONDUCTOR OPTICAL PREAMPLIFIER

[75] Inventors: Elliot Eichen, Arlington; Roger P. Holmstrom, Wayland; Joanne LaCourse, Hudson; Robert B. Lauer, Stow; William Powazinik, Marlborough; William C. Rideout, Townsend; John Schlafer, Wayland, all of Mass.

[73] Assignee: GTE Laboratories Incorporated, Waltham, Mass.

[21] Appl. No.: 521,205

[22] Filed: May 9, 1990

[51] Int. Cl.⁵ .............................................. H01S 3/19
[52] U.S. Cl. ........................................ 372/50; 357/19; 372/45; 372/46; 372/8
[58] Field of Search ............... 372/50, 43, 44, 45, 372/46, 47, 8; 250/393, 552, 206; 357/19

[56] References Cited

U.S. PATENT DOCUMENTS

| | | | |
|---|---|---|---|
| 3,835,407 | 9/1974 | Yariv et al. | 330/5 |
| 3,860,880 | 1/1975 | Yariv et al. | 330/5 |
| 3,873,828 | 3/1975 | Hunsperger | 250/211 |
| 3,945,110 | 3/1976 | Hunsperger | 29/572 |
| 4,065,729 | 12/1977 | Gover et al. | 331/94.5 |
| 4,484,144 | 11/1984 | Nakagome et al. | 330/4.3 |
| 4,653,058 | 3/1987 | Akiba et al. | 372/50 |
| 4,794,609 | 12/1989 | Hara et al. | 372/50 |
| 4,811,352 | 3/1989 | Suzuki et al. | 372/45 |
| 4,823,352 | 4/1989 | Sugimoto | 372/45 |
| 4,856,014 | 8/1989 | Fugueroa et al. | 372/46 |
| 4,899,361 | 2/1990 | Numai | 372/50 |
| 4,962,502 | 10/1990 | Adams | 372/8 |

OTHER PUBLICATIONS

M. J. O'Mahony, "Semiconductor Laser Optical Amplifiers for Use in Future Fiber Systems", J. of Lightwave Tech., vol. 6, No. 4, pp. 531-544, Apr. 1988.

Liou et al., "Monolithic Integrated InGa AsP/InP DFB Laser . . . Chem. Vapor Deposition", Post-Deadline Paper PD13, 11th Intl. IEEE Conf. on Semi Lasers, Boston (1988).

Antreasyan et al., "Stop-cleaved InGaAsP Laser Monilithically Integrated with a Monitoring Detector", Appl. Phys. Lett. 47(9), pp. 920-922 (Nov. 1, 1985).

Liou et al., "Asymmetric Optical Waveguide Y-Junction in InGaAsP/InP Photonic Integrated Circuits". Optical Fiber Comm. Conf., 1990 Tech. Digest Series, vol. 1, p. 183 (Jan. 25, 1990).

Liou et al., "Monolithic Integrated InGaAsP/InP DFB laser with Y-branching waveguide and a monitoring PD grown by MOCVD", Appl. Phys. Lett 54(20), pp. 114-116 (Jan. 9, 1989).

*Primary Examiner*—Georgia Epps
*Attorney, Agent, or Firm*—Victor F. Lohmann, III.

[57] ABSTRACT

An optical preamplifier includes a semiconductor optical amplifier monolithically integrated with an optical detector and electrically isolated from the detector by an isolation region. The isolation region consists of a low-loss, preferably transparent, insulating material whose index of refraction is matched to at least the refractive index of the amplifier, leading to reduced facet reflectivity at the amplifier output facet. Alternative device structures may include a waveguiding layer in the isolation region, a grating integrated with or following the optical amplifier, and a tuning region positioned between the amplifier and isolation region for filtering spontaneous emission.

30 Claims, 8 Drawing Sheets

MONOLITHICALLY INTEGRATED SEMICONDUCTOR OPTICAL PREAMPLIFIER

FIELD OF THE INVENTION

This invention relates to semiconductor optical devices and, more particularly, to the monolithic integration of an optical amplifier and detector which are electrically isolated from each other by an isolation region consisting of an insulating material.

1. Cross Reference to Related Application

This patent application is copending with an application entitled "Monolithically Integrated Ridge Waveguide Semiconductor Optical Preamplifier," Ser. No. 07/557,276, filed July 24, 1990 by the same inventors and assigned to the same assignee as the present invention.

2. Background of the Invention

Semiconductor optical amplifiers will play a key role in future wide band optical transmission and optical signal processing systems when employed in an optical preamplification system. In particular, the device formed by a semiconductor amplifier coupled to an optical detector operates as an optical preamplifier, amplifying the entering optical signal and then converting it to an electrical signal. For very high speed systems, such as those with a data rate greater than a few GBit/sec or a bandwidth greater than a few GHz, optical preamplification offers better performance in terms of signal-to-noise ratio than electrical preamplification, which initially detects the optical signal and then amplifies the detected signal electrically.

Semiconductor optical amplifiers are semiconductor lasers operating below threshold and include low reflectivity facets. Defining $P_{in}$ as the power (in watts) of the input optical signal and $P_{out}$ as the power (in watts) of the signal exiting the amplifier, the input and output powers of the amplifier are related by $$P_{out} = G P_{in} \quad (1)$$

The gain G can be written in terms of the input facet power reflectivity $R_1$, the output facet power reflectivity $R_2$, the single pass gain through the amplifier $G_s$, and the single pass phase shift through the amplifier $\beta$ as $$G = \frac{(1 - R_1)(1 - R_2)G_s}{[1 - (R_1 R_2 G_s)^{\frac{1}{2}}]^2 + 4(R_1 R_2 G_s)^{\frac{1}{2}} \sin^2 \beta} \quad (2)$$

Clearly, facet reflectivity is a significant design consideration in optical amplifiers.

The single pass gain, which can be greater than 30 dB, depends upon the materials, geometry, and doping of the epitaxial layers, the injection current, and the non-radiative losses. However, the actual (or useful) gain from the amplifier is limited by Fabry-Perot resonances, caused by reflections from each facet of the cavity. From a systems perspective, an acceptable amount of ripple in the gain due to these resonances is generally considered to be $\leq 3$ dB; this allows the amplifier (called a Traveling Wave Amplifier to distinguish it from an amplifier with large resonances, called a Fabry-Perot Amplifier) to be used with conventional semiconductor lasers without preselection for specific wavelengths, and without requiring extreme temperature stabilization of both laser and amplifier. FIG. 1 illustrates the problem of finite reflectivity by showing the gain versus wavelength for two different values of the single pass gain and two different values of the reflectivity. In order to achieve low gain ripple, FIG. 1 shows in curve 11 that the gain for the device with an effective reflectivity $R_e = 0.5\%$ (where $R_e = (R_1 R_2)^{\frac{1}{2}}$) is limited to approximately 15 dB. The same device with a lower effective reflectivity of $R_e = 0.05\%$ can achieve about ten times as much gain, which is approximately 25 dB as shown by curve 13. The other characteristic curves 10 and 12 show the ripple effect of devices with G=15 dB, $R_e = 0.05\%$ and G=25, $R_e = 5\%$ respectively.

Conventional approaches to reducing facet reflectivity have focused on the techniques of anti-reflection (AR) coating the facet with a single or multiple layer thin film and tilting the amplifying channel at an angle with respect to the amplifier facet. AR coatings with the required reflectivity ($\sim 10^{-4}$) on both facets have been fabricated, but with great difficulty. Although tilted stripe amplifiers have achieved reflectivities of $\sim 10^{-4}$, (Rideout et al. in "Ultra-low reflectivity semiconductor optical amplifiers without anti-reflection coatings", Electron. Lett., 26, 1990, p. 36.), the amplifiers have required narrow active regions to discriminate against higher order transverse modes. Consequently, a viable way to fabricate conventional semiconductor laser amplifiers has been to combine tilted facets with AR coatings.

In addition to the conventional problem of facet reflectivity, optical amplifiers also present another problem relating to the generation of optical noise. The signal-to-noise achieved with an optical preamplifier can be written as $$\frac{S}{N} = \frac{(\eta e P_{out}/h\nu)^2}{\{i_{th}^2 + \eta^2 i_{sig\text{-}sp}^2 P_{out} + \eta^2 i_{sp\text{-}sp}^2 + \eta_{shot}^2\}B} \quad (3)$$

where $\eta$ is any additional optical loss (including coupling loss from the amplifier) following the amplifier, e is electronic charge, hv is the energy/photon [joules], $P_{out}$ (the amplified output power) equals $\eta_{in} G P_{source}$ (where $\eta_{in}$ is any loss between the source and the amplifier including coupling into the amplifier), and $i^2_{th}$, $i^2_{sig\text{-}sp}$, $i^2_{sp\text{-}sp}$, and $i^2_{shot}$ are the detector thermal noise, signal-spontaneous beat noise, spontaneous-spontaneous beat noise, and shot noise coefficients, respectively. In most preamplifier applications, the optical noise caused by spontaneous-spontaneous emission (signal-spontaneous beat noise and spontaneous-spontaneous beat noise) is the dominant noise source so that other noise sources can be neglected.

OBJECTS OF THE INVENTION

It is a principal object of the present invention to obviate the above-noted and other disadvantages of the prior art.

It is a further object of the present invention to provide a novel monolithically integrated semiconductor preamplifier having an amplifier region electrically isolated from a detector region by an interposed isolation region consisting of an insulating material.

It is a further object of the present invention to monolithically integrate an optical amplifier with a detector region to form a preamplifier structure which is capable of reducing the reflectivity from the output facet of the amplifier by index matching the amplifier to an isolation region that is positioned between the amplifier and the detector.

It is a further object of the present invention to provide a monolithically integrated semiconductor preamplifier capable of achieving optimum performance by optically filtering the spontaneous-spontaneous beat noise emissions.

It is a yet further object of the present invention to provide a novel monolithically integrated semiconductor preamplifier characterized by simpler fabrication, greater reliability, and cheaper packaging costs relative to hybrid devices that couple discrete devices together.

SUMMARY OF THE INVENTION

The present invention is directed to a novel monolithically integrated semiconductor optical preamplifier device structure. The preamplifier comprises at least one optical amplifying region including an active layer for amplifying light and at least one optical detection region including a detection layer for detecting the amplified light. Furthermore, at least one isolation region comprised of an insulating material is positioned between the amplifying and optical detection regions for electrically isolating the amplifying region from the detection region. The isolation region is preferably transparent to the amplified light propagating through to the detection region, and is preferably index-matched to the amplifier region in order to reduce the reflectivity from the output facet of the amplifier.

DETAILED DESCRIPTION OF PREFERRED EMBODIMENTS

The present invention is directed to a novel semiconductor device structure comprising a semiconductor optical amplifier fabricated on the same chip with a high speed optical detector to form a monolithically integrated semiconductor optical preamplifier. In particular, a single-mode semiconductor amplifier is electrically isolated from a semiconductor optical detector by an isolation region, with the integrated amplifier/detector being fabricated monolithically on a single substrate. This isolation region consists of an insulating material which is preferably index-matched to both the amplifier and detector regions, and is preferably transparent to the amplified optical signal propagating through to the detector. The index-matching improves coupling of the amplifier to the detector by reducing the optical reflectivity from the output facet of the amplifier. Reducing facet reflectivity leads to better device performance and simpler fabrication in comparison to hybrid optical preamplifiers. The isolation region may be fabricated in either a bulk or waveguiding structure.

Figure 1:
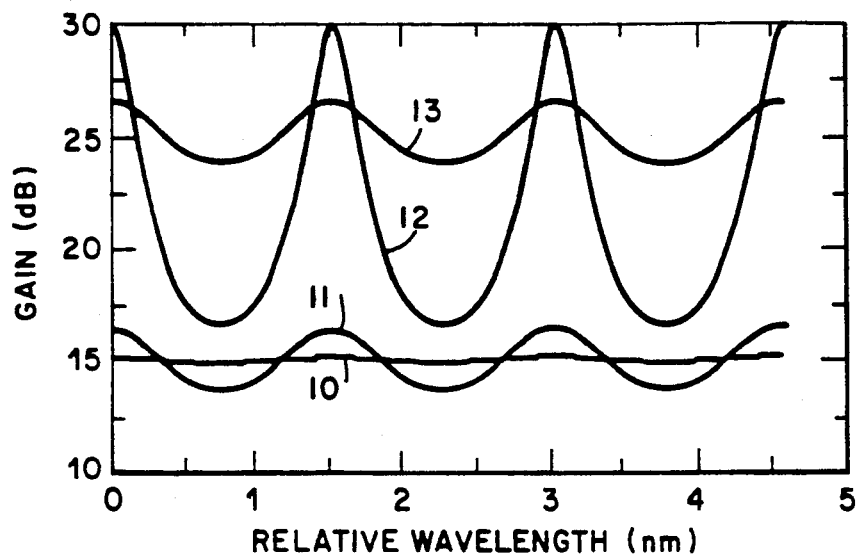
FIG. 1 shows gain as a function of wavelength for different values, of single pass gain and reflectivity in a conventional traveling wave amplifier.
Figure 2:
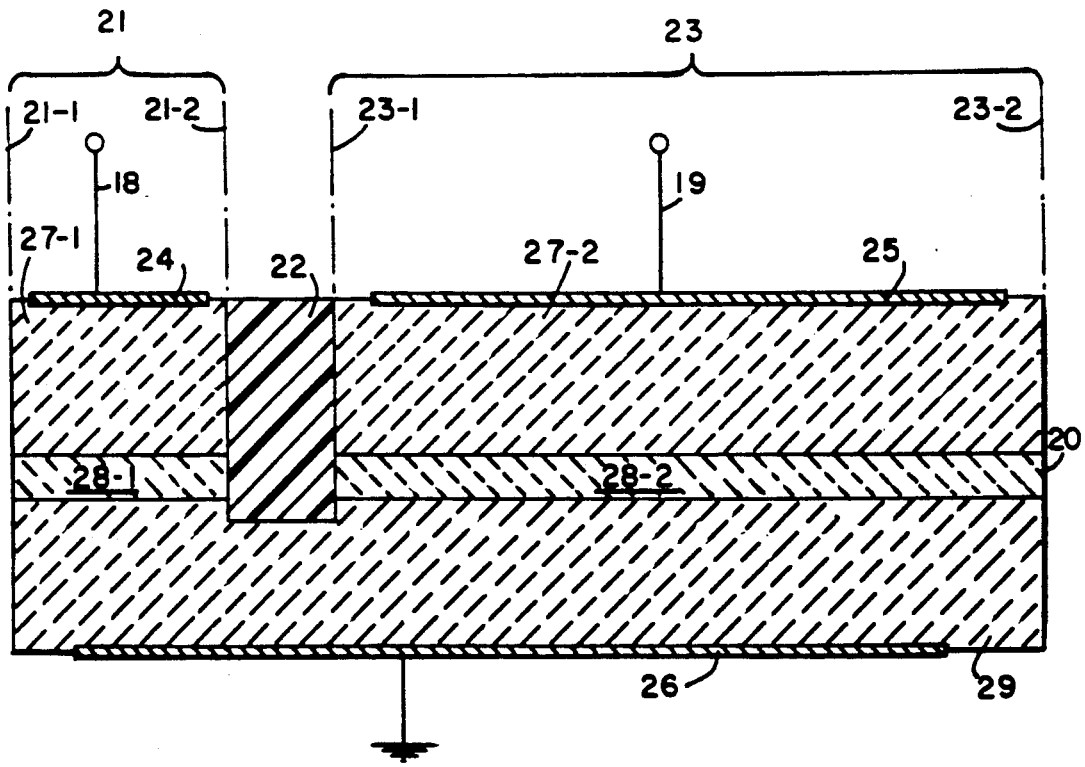
FIG. 2 is a lateral cross-sectional view of a novel monolithically integrated semiconductor optical preamplifier according to the present invention.
Figure 3:
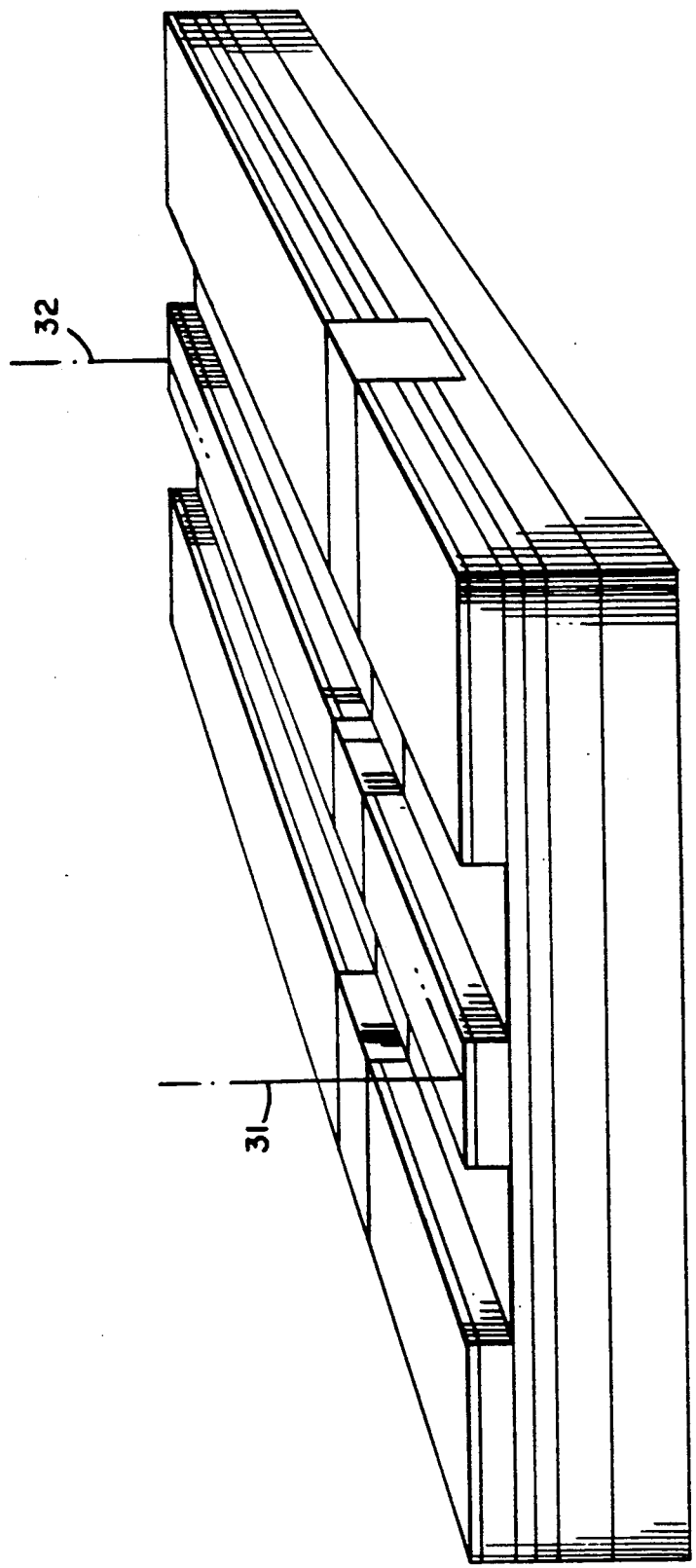
FIG. 3 is a perspective view of a preamplifier based on a ridge waveguide structure in accordance with the present invention.

FIG. 2 shows a lateral cross-sectional view of a novel monolithically integrated semiconductor optical preamplifier according to the present invention. The preamplifier comprises an amplifier region 23 identified as the structure between broken lines 23-1 and 23-2, an isolation region 22, and a detection region 21 identified as the structure between broken lines 21-1 and 21-2. A specific preamplifier device structure based on a ridge waveguide design is shown in the perspective view of FIG. 3, where a lateral cross-section of the device taken through the plane defined by lines 31 and 32 produces the view shown in FIG. 2.

The preamplifier of FIG. 2 is fabricated by first overlaying a contiguous active layer on substrate 29, and then forming a contiguous barrier layer on this active layer. The isolation region 22 is then formed by etching a groove perpendicular to a longitudinal direction through the active layer, and refilling the groove with an insulating material whose index of refraction is preferably matched to the index of refraction of the material system of the amplifier and detector. As a result of the etching process, the previously contiguous active layer is separated into isolated active layers 28-1 and 28-2 in the detector and amplifier regions, respectively, while the initially formed barrier layer is separated into isolated barrier layers 27-1 and 27-2.

For purposes of biasing the preamplifier, the amplifier region 23 includes an upper electrode 25 with terminal connection 19, with the detector region similarly including an upper electrode 24 with terminal connection 18. A ground electrode 26 attached to the underside of substrate 29 extends into both the amplifier and detector regions.

A preamplifier structure in accordance with the present invention consists of an n-InP substrate material 29, active layers 28-1 and 28-2 formed from a p-InGaAsP material, barrier layers 27-1 and 27-2 consisting of a p-InP material, and isolation region 22 formed from an insulating Fe-doped InP material. Voltage levels of 1.5V and −5V applied to electrodes 25 and 24, respectively, were chosen as the operating bias voltages. During preamplifier operation, the voltage levels present at the terminal connections are operative in applying a reverse bias to the detector p-n junction, and applying a forward bias to the amplifier p-n junction.

After biasing, an input optical signal desired for preamplification is applied to an input facet 20 of active layer 28-2 of the amplifier region 23. The signal is thereafter amplified in the active layer as it propagates toward the isolation region 23. At the facet interface between the active layer 28-2 and isolation region 22, the index-matching of the amplifier region to the isolation region produces a low reflectivity at this facet interface. Due to the low-loss characteristic of the material system of the isolation region, the amplified signal propagates through the region 22 with minimal loss before entering the active layer 28-1 of detection region 21 where the optical signal is detected. As noted before, the effect of the index-matching is to improve coupling of the amplified optical signal from the amplifier region to the detection region.

The particular material system discussed above should not serve as a limitation of the present invention since it should be obvious to those skilled in the art that the novel preamplifier may be fabricated from other material systems and other fabrication techniques that are within the scope of the present invention. Furthermore, the amplifier and detector regions may include semiconductor structures other than the exemplary double-heterojunction discussed above. For example, the detector regions may include a single heterojunction structure or quantum well region such as a single quantum well or multiple quantum well. The amplifier region may also be comprised of single or multiple quantum wells.

The isolation region 22 between the amplifier and detector regions in FIG. 2 serves two critical functions. The first is that by electrically isolating the amplifier region 23 from the detector region 21, the isolation region allows the p-n junctions of these two regions to be biased with opposite polarities so that one region operates as an amplifier and the other region as a detector. For the structures shown in FIGS. 2 and 3, the detector structure is identical to that of the amplifier, making this device particularly simple to fabricate. However, the detector need not be a waveguide, and could be of a different structure with different semiconductor materials. One alternative detector structure would include a p-i-n region, as will be discussed below in reference to FIG. 6.

The second critical function served by the electrical isolation region 22 is index-matching the insulating material of the region 22 to the material systems of the amplifier and detector. The resultant reduction in facet reflectivity from the output facet of the amplifier adjacent to the isolation region 22 greatly eases the tolerance required on the first or input facet reflectivity when high gain, traveling wave performance is desired. For example, if the device in FIG. 2 was employed in an optical fiber system which transmits at the most common operating wavelength of 1.3 μm, the amplifier and detector region would be fabricated in the InGaAsP-/InP material system, and would have an effective refractive index of approximately 3.35. If the insulating material was semi-insulating Fe-doped InP with a refractive index of 3.2, the reflection coefficient at the output facet of the amplifier would be given by $$R_2 = \left| \frac{N_{InGaAsP} - N_{InP}}{N_{InGaAsP} + N_{InP}} \right|^2 = 5.2 \times 10^{-4}. \quad (4)$$

Figure 10:
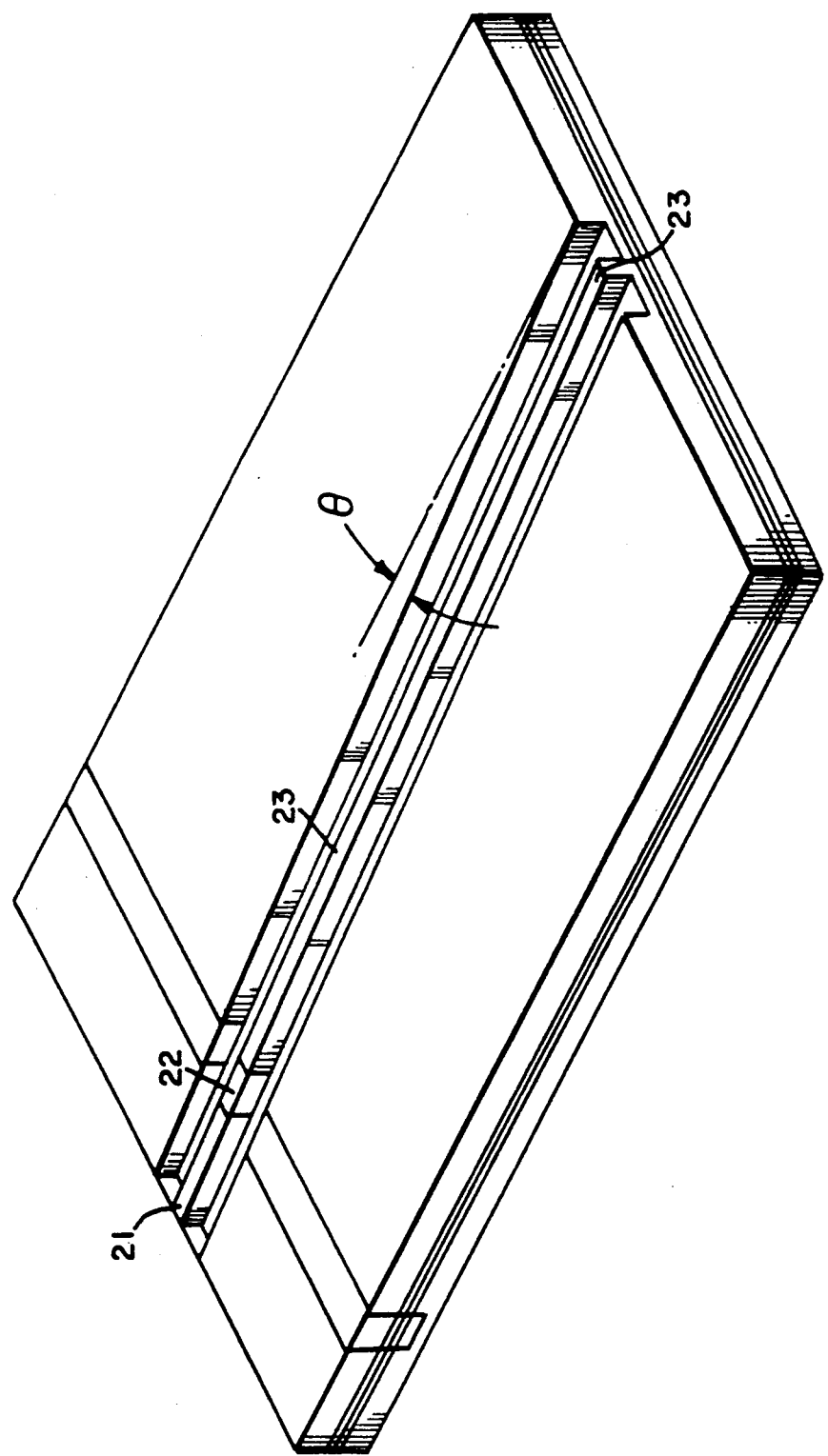
FIG. 10 is a perspective view of a preamplifier based on a titled ridge waveguide structure in accordance with the present invention.

Furthermore, with reference to FIG. 10, if the amplifier waveguide is tilted at $\theta = 7°$ to the waveguide axis, the facet reflectivity would be additionally reduced by about $10^{-4}$, yielding an effective second facet reflectivity of $R_2 = 5 \times 10^{-8}$.

Figure 4:
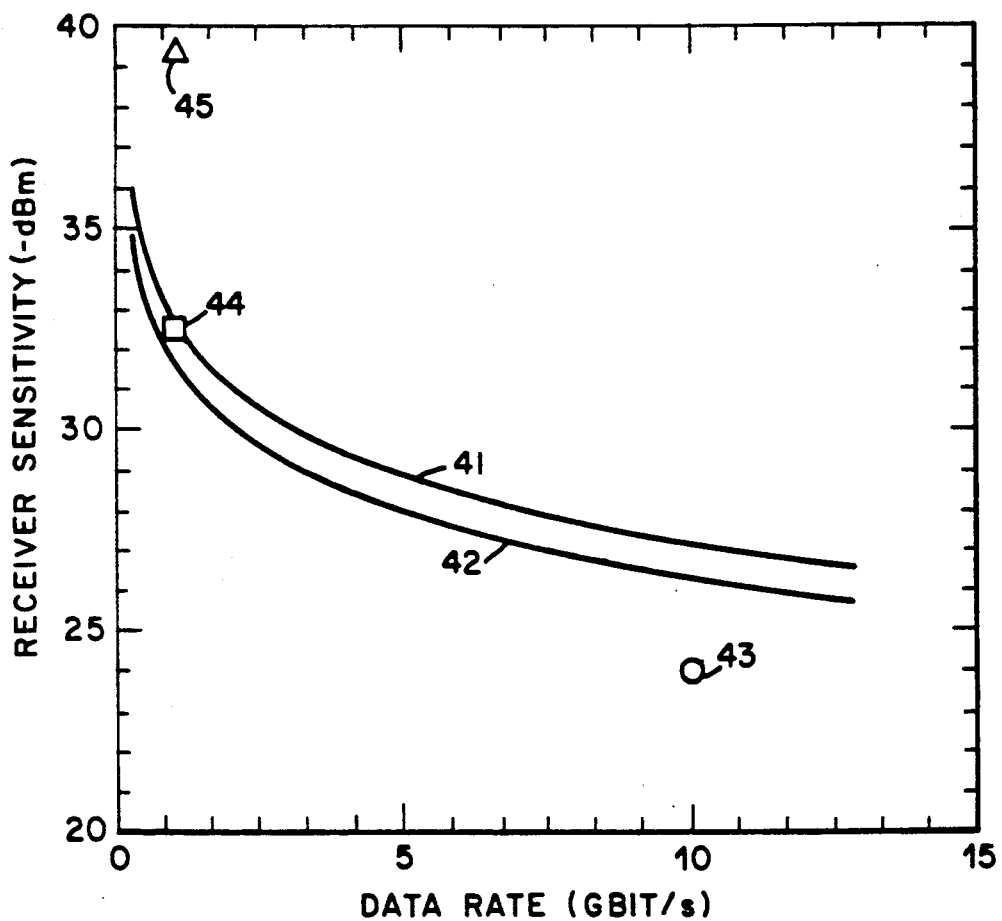
FIG. 4 compares the performance, as measured by receiver sensitivity, of the device shown in FIG. 3 with several conventional electrical preamplifiers.

The performance of an optical preamplifier depends upon the detailed structure used to implement the preamplifier and the system design parameters such as data rate, coding, and clock recovery. FIG. 4 shows the expected performance of the device shown in FIG. 2 by plotting receiver sensitivity as a function of data rate to calculate the received optical power (dBm) needed to obtain a $10^{-9}$ Bit Error Rate (BER) in a single channel ASK modulated signal. The performance of the preamplifier with a coupling efficiency of 16% is represented by curve 42, while the expected performances of the preamplifier with efficiencies of 50% and 100% are approximately equal and are thereby represented by curve 41. For purposes of comparison with electrical preamplifiers, FIG. 4 also shows the received optical power required by a p-i-n-FET (curve 44), a p-i-n-HEMT (curve 43), and an APD (curve 45). At relatively low data rates ($\leq 1$ GBit/s), the graph shows that the performance of the integrated optical preamplifier is marginally poorer than more conventional pin-FET receivers. At higher data rates, however, the performance of the optical preamplifier becomes better than the performance of electrical preamplifiers. Additionally, the monolithically integrated preamplifier device has a practical bandwidth potential which is much wider than that of electrical preamplifiers.

Figure 5:
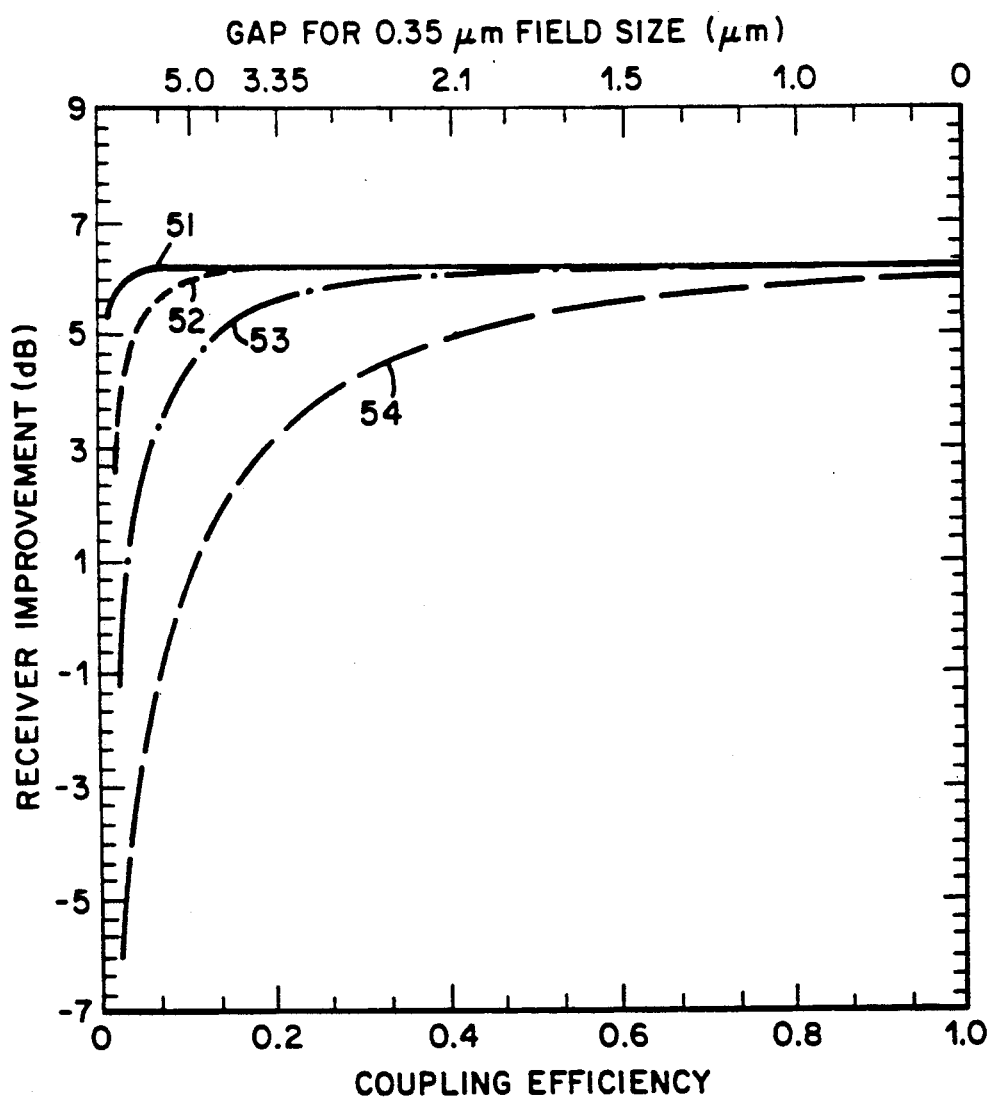
FIG. 5 shows the improvement in received optical power as a function of the width of the isolation region for the device shown in FIG. 3 when the amplifier is utilized in a 50 channel FM SCM system.

In addition to applications in an ASK modulation format system, the integrated optical preamplifier of the present invention is useful as a receiver in an optical subcarrier multiplexed (SCM) transmission system. SCM systems are typically so broadband (approximately 2–10 GHz) that conventional receiver devices have been limited to p-i-n detectors coupled to a low noise, wideband, 50 ohm microwave amplifier. FIG. 5 shows the improvement in received optical power compared to a conventional p-i-n FET as a function of gap between detector and amplifier for a 50 channel FM SCM system when the optical preamplifier of FIG. 2 is employed as a receiver. Curves 51, 52, 53, and 54 represent performance curves for a preamplifier with gains of 30, 25, 20, and 15 dB, respectively. The system has the following parameters: Bandwidth/channel = 40 MHz, Modulation depth = 7%, Semiconductor Amp Noise Figure = 6 dB, Carrier-to-Noise = 16.5 dB, Input Coupling Loss = 4 dB, and Detector Quantum Efficiency = 0.6. In addition to the improved performance exhibited in FIG. 5, the present invention offers the advantages of size, power consumption, reliability, and decreased electronic complexity, making the integrated preamplifier a very attractive component for applications in subscriber terminal equipment.

While what has been shown and described in FIG. 2 is a generalized structure of a novel integrated optical preamplifier, the present invention includes all other preamplifier structures which include at least one amplifier region, at least one detector region, and at least one isolation region which electrically isolates the amplifier region from the detector region. Accordingly, the discussion below of FIGS. 6-9 should not serve to limit the invention to the particular embodiments illustrated therein of the preamplifier device shown in FIG. 2.

Figure 6:
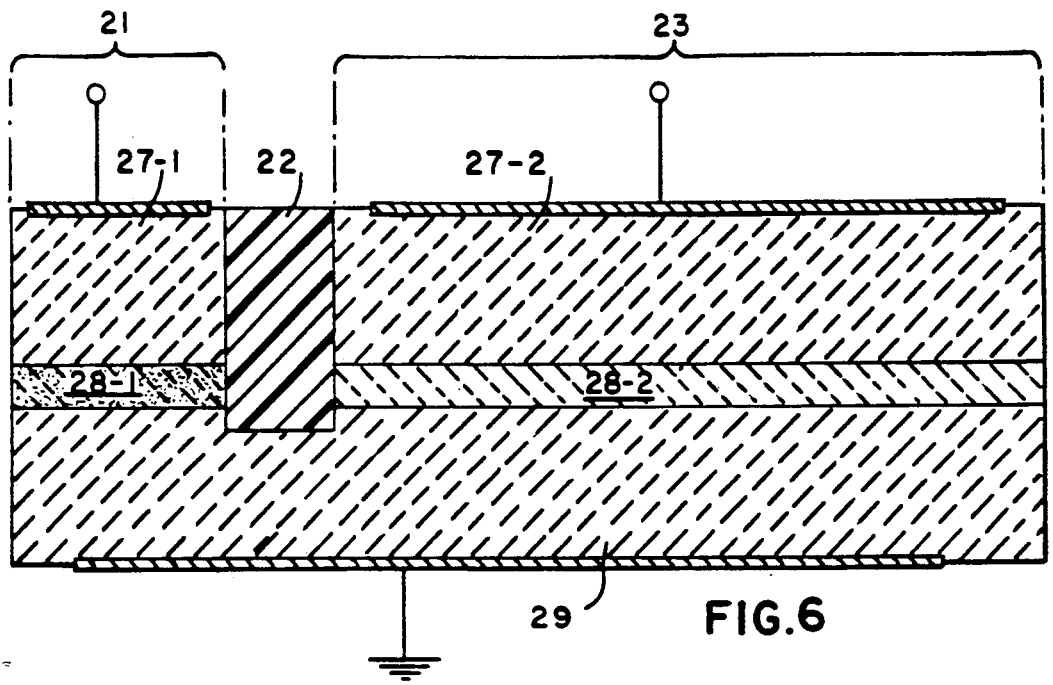
FIG. 6 is a lateral cross-sectional view of a first embodiment of the device according to FIG. 2 wherein the detection region includes a p-i-n structure.

FIG. 6 is a lateral cross-sectional view of an integrated semiconductor preamplifier in accordance with a first embodiment of the present invention. The preamplifier structure is identical to that of FIG. 2, except that the detector region 21 includes a p-i-n region rather than a p-n region as in FIG. 2. A preamplifier in accordance with FIG. 6 includes an n-InP substrate 29 and an isolation region 22 made from insulating Fe-doped InP. The detector region further includes an i-layer 28-1 fabricated from lightly doped n-type InGaAs and a p-InP barrier layer 27-1, while the amplifier region 23 includes an active layer 28-2 of p-InGaAsP and a barrier layer 27-2 of p-InP.

Figure 7:
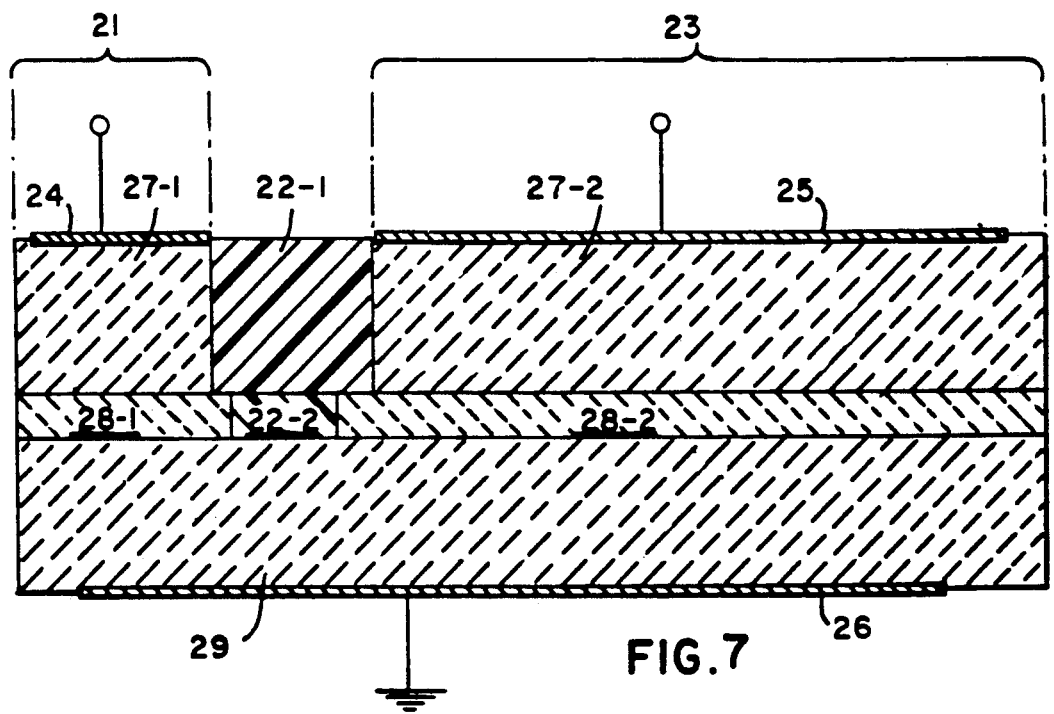
FIG. 7 is a lateral cross-sectional view of a second embodiment, of the device according to FIG. 2 wherein a waveguiding isolation region couples the amplifier to the detector.

FIG. 7 is a lateral cross-sectional view of a preamplifier in accordance with a second embodiment of the structure in FIG. 2. The device structure includes an amplifying region 23 with an active layer 28-2 overlaying a portion of substrate 29, and a barrier layer 27-2 formed on active layer 28-2. The detector region 21 includes an active layer 28-1 formed on a portion of substrate 29 and a barrier layer 27-1 disposed on layer 28-1. The inner faces of barrier layers 27-1 and 27-2 are adjacent to and contiguous with an isolation cladding region 22-1 having a low index of refraction.

Formed between the lower surface of isolation region 2-1 and a portion of the upper surface of substrate 29 in FIG. 7 is a waveguiding isolation region 22-2 which is aligned with active layers 28-1 and 28-2 so that amplified light from active layer 28-2 is guided by the waveguiding region 22-2 into the active layer 28-1 of detector region 21. The isolation cladding region 22-1 consists of a material with a low index of refraction that is non lattice-matched to the barrier layers 27-1 and 27-2 of the detector and amplifier regions, respectively.

A preamplifier device in accordance with the structural features of FIG. 7 consists of a material system in which barrier layers 27-1 and 27-2 are p-InP, active layers 28-1 and 28-2 are p-InGaAsP, the substrate 29 consists of an n-InP material, and the waveguiding region 22-2 is formed from Fe-doped InP. The same electrode structures 24, 25 and 26 and respective biasing voltages present in the device of FIG. 2 are used in the device of FIG. 7.

Figure 8:
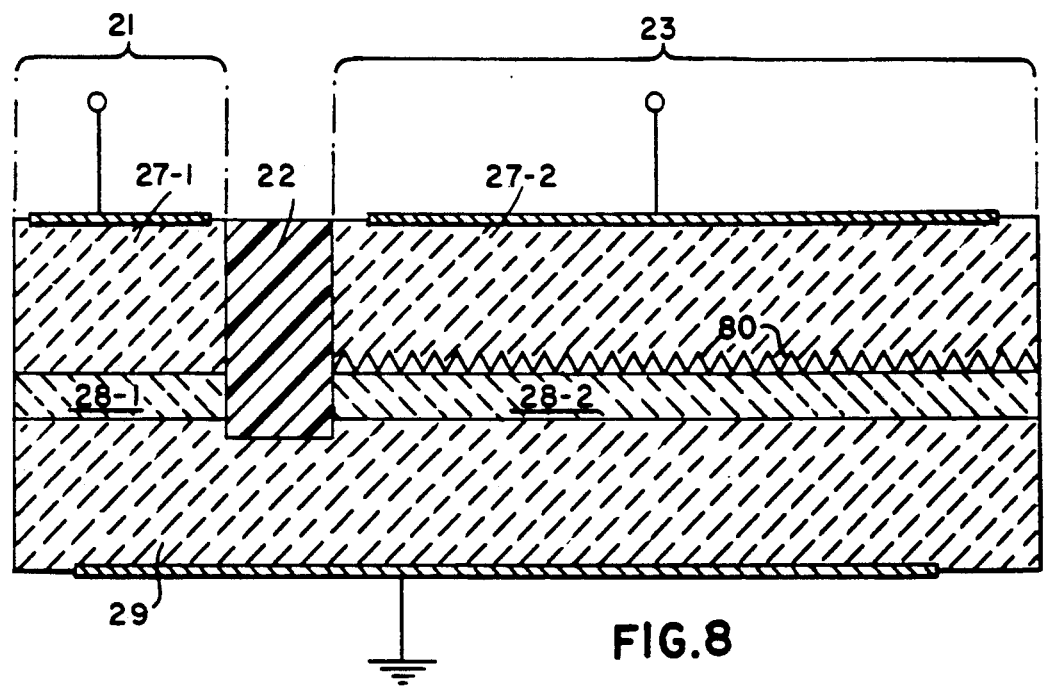
FIG. 8 is a lateral cross-sectional view of a third embodiment of the device according to FIG. 2 wherein a grating is integrated with the amplifier region.

FIG. 8 is a lateral cross-sectional view of a preamplifier structure in accordance with a third embodiment of the device in FIG. 2. The device is structured similarly to that in FIG. 2 and further includes a grating structure 80 integrated with the active region 28-2 of amplifier region 23. The grating is similar to that which is utilized in a conventional DFB laser. The grating optically filters spontaneous-spontaneous beat noise emissions, allowing the integrated preamplifier to achieve close to optimum performance. In an alternate embodiment, the grating is integrated with a filter region adjacent to the amplifier region and contiguous with the isolation region.

Figure 9:
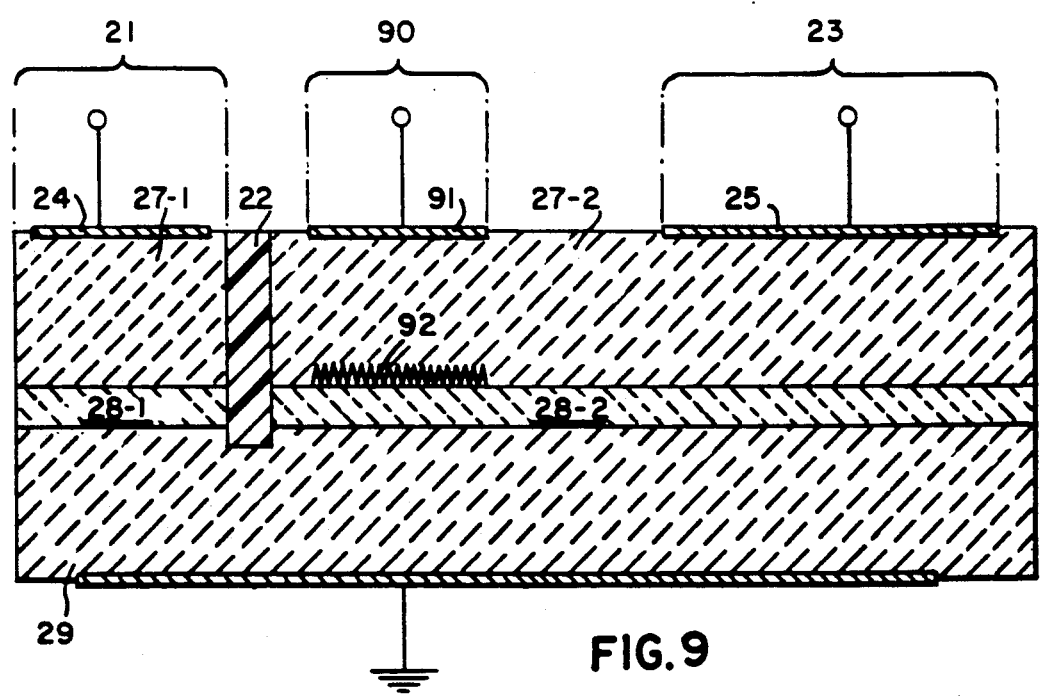
FIG. 9 is a lateral cross-sectional view of a fourth embodiment of the device according to FIG. 2 wherein a tunable waveguiding region is positioned between the amplifier and detector.
Figure 11:
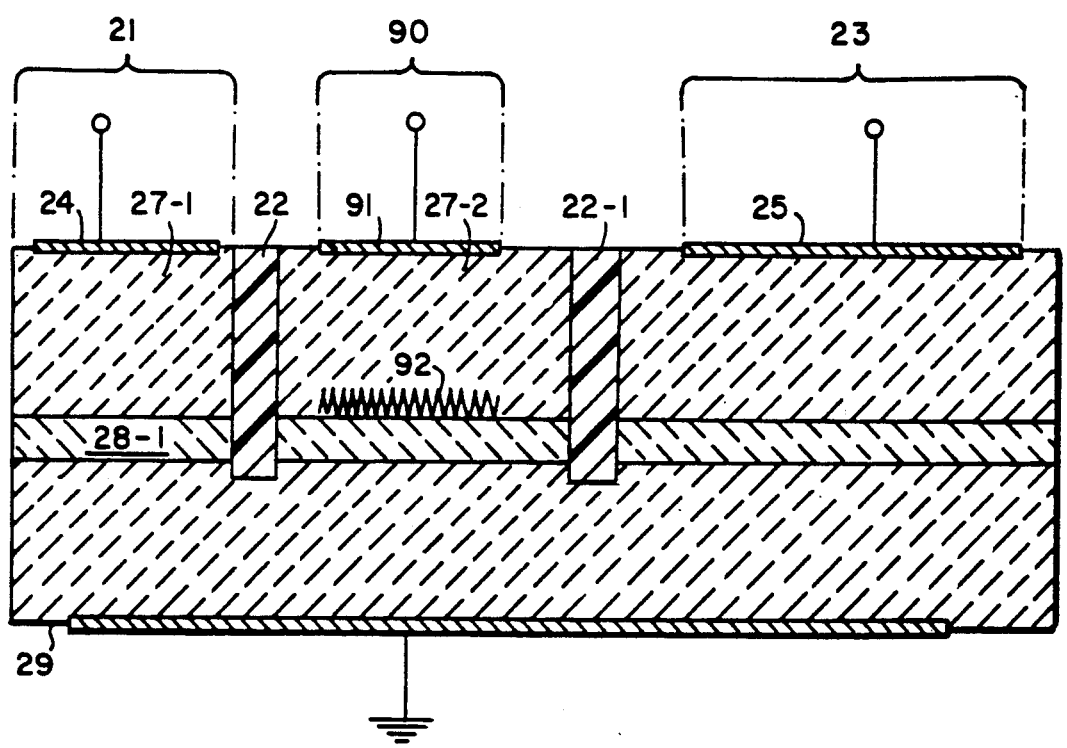
FIG. 11 is a lateral cross-sectional view of an embodiment of the device according to FIG. 9 wherein an isolation region is interposed between the turning region and amplifying region.

A fourth embodiment of the present invention is shown in FIG. 9 as a lateral cross-sectional view of an integrated preamplifier. The semiconductor preamplifier device includes an amplifier region 23 adjacent to a tuning region 90, with an insulating region 22 electrically isolating the tuning region 90 from a detector region 21. The tuning region operates to filter spontaneous emission. The amplifier region is defined as that portion of the semiconductor device extending beneath electrode 25, the tuning region is defined as the section of the semiconductor device extending beneath electrode 91, and the detector region is defined as that portion of the semiconductor device extending beneath electrode 24. Each region is biased into operation by the application of appropriate voltage levels to the respective electrodes. AS illustrated in FIG. 11, the preamplifier may further include a second isolation region 22-1 between the tuning and amplifier region. The preamplifier described above may also include a grating structure 92 integrated with the tuning region as shown in FIG. 9.

As shown, the semiconductor device includes active layers 28-1 and 28-2 disposed on a substrate 29, and barrier layers 27-1 and 27-2 formed on layers 28-1 and 28-2, respectively. The active layer 28-2 and barrier layer 27-2 extend across both the tuning and amplifier region. A specific device structure in accordance with FIG. 9 includes an n-InP substrate 29, p-InGaAsP active layers 28-1 and 28-2, p-InP barrier layers 27-1 and 27-2, and an insulating Fe-doped InP isolation region 22.

The device is biased into operation by applying voltage levels of 1.5, +1, and −5V to the electrode terminals of the amplifier, tuning, and detector regions, respectively.

What has been shown and described herein is a novel semiconductor optical preamplifier comprised of a semiconductor optical amplifier integrated with and electrically isolated from an optical detector, with both structures fabricated on the same substrate. The isolation region between the amplifier and detector consists of an insulating material whose index of refraction is matched to the refractive index of at least the amplifier. This index matching leads to better device performance due to reduced facet reflectivity, simpler fabrication, smaller and more reliable devices, and considerably less expensive packaging costs in comparison to hybrid devices.

What is claimed is:

1. A wide-bandwidth monolithically integrated optical preamplifier, comprising:
    at least one amplifying region including a traveling wave amplifier having an active layer for amplifying a light signal applied to said active layer;
    at least one optical detection region including a detection layer for detecting said amplified light;
    at least one electrical isolation region comprised of a low-loss insulating material and positioned between said amplifying and optical detection regions; and
    electrodes provided to each of said amplifying and optical detection regions.

2. The preamplifier as recited in claim 1 wherein:
    at least one amplifying region is contiguous with an isolation region, and wherein the insulating material of said isolation region is refractively index-matched to a material of said one amplifying region.

3. The preamplifier as recited in claim 1 wherein:
    said isolation region is transparent to said amplified light.

4. A wide-bandwidth monolithically integrated optical preamplifier, comprising:
    an amplifying region including a traveling wave amplifier having an active layer for amplifying a light signal applied to said active layer;
    an optical detection region including a detection layer for detecting said amplified light;
    an electrical isolation region comprised of a low-loss insulating material and positioned between said amplifying and optical detection regions; and electrodes provided to each of said amplifying and optical detection regions.

5. The preamplifier as recited in claim 4 wherein said amplifying region further including:
a waveguide angled with respect to a longitudinal axis of said amplifying region.

6. The preamplifier as recited in claim 1 wherein said amplifying region further including:
a waveguide angled with respect to a longitudinal axis of said amplifying region.

7. The preamplifier as recited in claim 4 wherein said amplifying region further including:
a heterostructure.

8. The preamplifier as recited in claim 4 wherein said optical detection region further including:
a heterostructure.

9. The preamplifier as recited in claim 7 wherein said heterostructure includes:
a quantum well region 10. The preamplifier as recited in claim 8 wherein said heterostructure includes:
a quantum well region.

11. The preamplifier as recited in claim 4 wherein:
said amplifying region is contiguous with said isolation region and wherein the insulating material of said isolation region is refractively index-matched to a material of at least said amplifying region.

12. The preamplifier as recited in claim 4 wherein:
said isolation region is transparent to said amplified light.

13. A wide-bandwidth monolithically integrated optical preamplifier, comprising:
an amplifying region including a traveling wave amplifier having an active layer for amplifying a light signal applied to said active layer;
an optical detection region including a detection layer for detecting said amplified light;
an electrical isolation region positioned between said amplifying and optical detection region, and including a waveguiding region comprised of a low-lose insulating material for guiding said amplified light to said detection layer; and
electrodes provided to each of said amplifying and optical detection regions.

14. The preamplifier as recited in claim 13 wherein said isolation region further including:
a cladding region disposed on said waveguiding region.

15. The preamplifier as recited in claim 13 wherein:
the active layer of said amplifying region is contiguous with said waveguiding region, and wherein the insulating material of said waveguiding region is index-matched to a material constituency of at least the active layer of said amplifying region.

16. The preamplifier as recited in claim 13 wherein:
said waveguiding region is transparent to said amplified light.

17. The preamplifier as recited in claim 13 wherein said amplifying region further including: a waveguide angled with respect to a longitudinal axis
of said amplifying region.

18. A wide-bandwidth monolithically integrated optical preamplifier, comprising:
an amplifying region including a traveling wave amplifier having an active layer for amplifying a light signal applied to said active layer;
an optical detection region including a detection layer for detecting said amplified light;
an electrical isolation region comprised of a low-loss insulating material and positioned between said amplifying and optical detection regions; and
electrodes provides to each of said amplifying and optical detection regions.

19. The preamplifier as recited in claim 18 wherein:
said isolation region is contiguous with said amplifying region, and wherein the insulating material of said isolation region is refractively index-matched to a material of at least said amplifying region.

20. The preamplifier as recited in claim 18 wherein:
said isolation region is transparent to said amplified light.

21. The preamplifier as recited in claim 18 wherein said amplifying region further including:
a waveguide angled with respect to a longitudinal axis of said amplifying region.

22. A wide-bandwidth monolithically integrated optical preamplifier, comprising:
an amplifying region including a traveling wave amplifier having an active layer for amplifying a light signal applied to said active layer;
a filter region adjacent to said amplifying region and including a grating for filtering said amplified light;
an optical detection region including a detection layer for detecting said filtered light;
an electrical isolation region comprised of a low-loss insulating material and positioned between said filter and optical detection regions; and
electrodes provided to each of said amplifying and optical detection regions;
wherein said preamplifier operates below a threshold condition.

23. The preamplifier as recited in claim 22 wherein:
said isolation region is contiguous with said filter region, and wherein the insulating material of said isolation region is refractively index-matched to a material of at least said filter region.

24. The preamplifier as recited in claim 22 wherein:
said isolation region is transparent to said filtered light.

25. A wide-bandwidth monolithically integrated optical preamplifier, comprising:
an amplifying region including a traveling wave amplifier having an active layer for amplifying a light signal applied to said active layer;
a tuning region for selectively filtering said amplified light;
an optical detection region including a detection layer for detecting said filtered light;
an electrical isolation region comprised of a low-loss insulating material and positioned between said tuning region and said optical detection region; and
electrodes provided to each of said amplifying region, said optical detection region, and said tuning region.

26. The preamplifier as recited in claim 25 wherein:
said isolation region is contiguous with said tuning region, and wherein the insulating material of said isolation region is refractively index-matched to a material of at least said tuning region.

27. The preamplifier as recited in claim 25 further including:
a grating integrated with said tuning region.

28. The preamplifier as recited in claim 25 further including:

an amplifier electrical isolation region comprised of an insulating material and positioned between said amplifying region and said tuning region, said amplifier isolation region being transparent to said amplified light.

29. The preamplifier as recited in claim 28 wherein: said amplifier isolation region is contiguous with said amplifying region, and wherein the insulating material of said amplifier isolation region is refractively index-matched to a material of at least said amplifying region.

30. The preamplifier as recited in claim 25 wherein: said isolation region is transparent to said filtered light.

* * * * *